(12) United States Patent
Cho (10) Patent No.: US 10,431,610 B2
(45) Date of Patent: Oct. 1, 2019

(54) X-RAY DETECTING PANEL AND MANUFACTURING METHOD THEREOF

(71) Applicant: SAMSUNG DISPLAY CO., LTD., Yongin, Gyeonggi-Do (KR)

(72) Inventor: Sung-Woo Cho, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 453 days.

(21) Appl. No.: 14/272,625

(22) Filed: May 8, 2014

(65) Prior Publication Data

US 2015/0034944 A1 Feb. 5, 2015

(30) Foreign Application Priority Data

Aug. 2, 2013 (KR) .......................... 10-2013-0091907

(51) Int. Cl.
*H01L 27/146* (2006.01)
*H01L 27/12* (2006.01)

(52) U.S. Cl.
CPC .... *H01L 27/1288* (2013.01); *H01L 27/14663* (2013.01); *H01L 27/1214* (2013.01)

(58) Field of Classification Search
CPC ......... H01L 27/14676; H01L 27/14658; H01L 27/14659; G01T 1/24–247
See application file for complete search history.

(56) References Cited

U.S. PATENT DOCUMENTS 8,039,809 B2* 10/2011 Okada ............... H01L 27/14658
250/208.1
2010/0200859 A1 8/2010 Joo et al.

FOREIGN PATENT DOCUMENTS

| KR | 2004-0012209 A | 2/2004 |
| KR | 2004-0050946 A | 6/2004 |
| KR | 2006-0130860 A | 12/2006 |
| KR | 2008-0102488 A | 11/2008 |

* cited by examiner

*Primary Examiner* — Daniel Whalen
*Assistant Examiner* — Scott Stowe
(74) *Attorney, Agent, or Firm* — Lee & Morse, P.C.

(57) ABSTRACT

A panel to detect X-rays includes a plurality of signal lines, a plurality of gate lines, and a plurality of cells in areas adjacent intersections of respective ones of the gate and control lines. A first area includes a first cell having a driving circuit, and a second area includes a second cell which omits a driving circuit. Data lines connected to respective ones of the cells carry signals from which an X-ray image is generated. The second cell may be located in a dummy cell area of the panel.

6 Claims, 7 Drawing Sheets

X-RAY DETECTING PANEL AND MANUFACTURING METHOD THEREOF

CROSS-REFERENCE TO RELATED APPLICATION

Korean Patent Application No. 10-2013-0091907, filed on Aug. 2, 2013, and entitled "X-Ray Detecting Panel and Manufacturing Method Thereof," is incorporated by reference herein in its entirety.

BACKGROUND

1. Field

One or more embodiments described herein relate to an X-ray detecting panel.

2. Description of the Related Art

X-rays are electromagnetic waves having wavelengths in the range of tens of pm to several nm. These rays exhibit high transmission and linearity, and also exhibit good penetration through a subject.

During an X-ray operation, some X-rays penetrate the subject while others are absorbed according to the density of the subject. The amount of X-rays which penetrates through the subject may be different from the amount of X-rays that were directed toward the subject before penetration. Through X-ray detection, the inside of the subject may be imaged by measuring the amount of X-rays penetrating the subject.

Early generation X-ray detection captured images on film or magnetic tape. Recently, a digital semiconductor detector has been used. A digital semiconductor detector converts X-rays and/or visible light into electrical signals. The converted electrical signals are then transformed into digital signals by a readout integrated circuit (ROIC) for viewing.

A variety of X-ray detection methods have been proposed. Examples include a direct detection method and an indirect detection method. In a direct detection method, electron-hole pairs generated in direct response to X-rays are detected. In an indirect detection method, X-rays are converted into visible light using a scintillator. The visible light is then detected in order to produce a viewable image.

Generally, the direct detection method may be implemented with fewer steps than the indirect detection method. However, the direct detection method may have low conversion efficiency of X-rays and the lifespan of a semiconductor layer that converts X-rays into electrical signals may be relative short. Because of these drawbacks, the indirect detection method has been the method of choice in many applications.

SUMMARY

In accordance with one embodiment, an X-ray detecting panel includes a substrate, m gate lines on the substrate, n data lines on the substrate and intersecting the m gate lines, a thin film transistor in an area between the first gate line and the $(m-1)^{th}$ gate line on the substrate, a non-driving element in an area between the $(m-1)^{th}$ gate line and the $m^{th}$ gate line on the substrate, and a photoelectric converter connected to the thin film transistor.

The non-driving element may include a gate electrode connected to the $m^{th}$ gate line and a semiconductor layer insulated from the gate electrode. An entire surface of the semiconductor layer may be in direct contact with an insulating layer. The insulating layer includes a gate insulating layer and a capping layer. One surface of the semiconductor layer may be in direct contact with the gate insulating layer and at least one other surface of the semiconductor layer is in direct contact with the capping layer The non-driving element may not include a source electrode and a drain electrode. The non-driving element may include a gate electrode connected to the $m^{th}$ gate line and a gate insulating layer covering the gate electrode. The non-driving element may not include a semiconductor layer, a source electrode, and a drain electrode.

In accordance with another embodiment, a method of making an X-ray detecting panel includes forming a thin film transistor on a substrate, forming a photoelectric converter on the substrate including the thin film transistor, and arranging a scintillator layer on the substrate including the photoelectric converter, wherein forming of the thin film transistor on the substrate includes: forming m number of gate lines and a gate electrode connected to the gate lines; forming a gate insulating layer on the gate lines and the gate electrode; forming a semiconductor layer at a position corresponding to the gate electrode on the gate insulating layer, by coating a semiconductor-forming material and patterning the semiconductor-forming material; and forming a data line, and forming a source electrode and a drain electrode between the $1^{st}$ gate line and the $(m-1)^{th}$ gate line by coating a source-drain electrode-forming material on the semiconductor layer and patterning the source-drain electrode-forming material, wherein the source electrode and drain electrode are not formed between the $(m-1)^{th}$ gate line and the $m^{th}$ gate line.

The operations of forming of the semiconductor layer and forming of the source electrode and drain electrode between the $1^{st}$ gate line and the $(m-1)^{th}$ gate line may include sequentially coating the semiconductor-forming material and the source-drain electrode-forming material, and patterning the materials simultaneously with a single mask. The semiconductor layer may not be formed on a gate electrode between the $(m-1)^{th}$ gate line and the $m^{th}$ gate line.

In accordance with another embodiment, a panel to detect X-rays includes a plurality of signal lines, a plurality of gate lines, and a plurality of cells in areas adjacent intersections of respective ones of the gate lines and control lines, wherein a first area includes a first cell having a driving circuit and a second area includes a second cell which omits a driving circuit. The driving circuit may have a gate, drain, and source, and the second cell may include a first electrode and may omits at least one second terminal, wherein the first terminal is a gate and the at least one second terminal is one of a source or drain. The second cell may omit a second terminal corresponding to a source and a third terminal corresponding to a drain.

The second cell may be coupled to a last one of the gate lines. One of the signal lines may overlap the second area, and 0the signal line that overlaps the second area may be spaced from a terminal connected to one of the gate lines.

The second cell may include a photoelectric converter, and the signal line that overlaps the second area may overlap the photoelectric converter. The plurality of signal lines includes bias lines. The first and second cells may include a photoelectric converter. A plurality of data lines may be connected to respective ones of the cells, and the plurality of signal lines may be bias lines.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
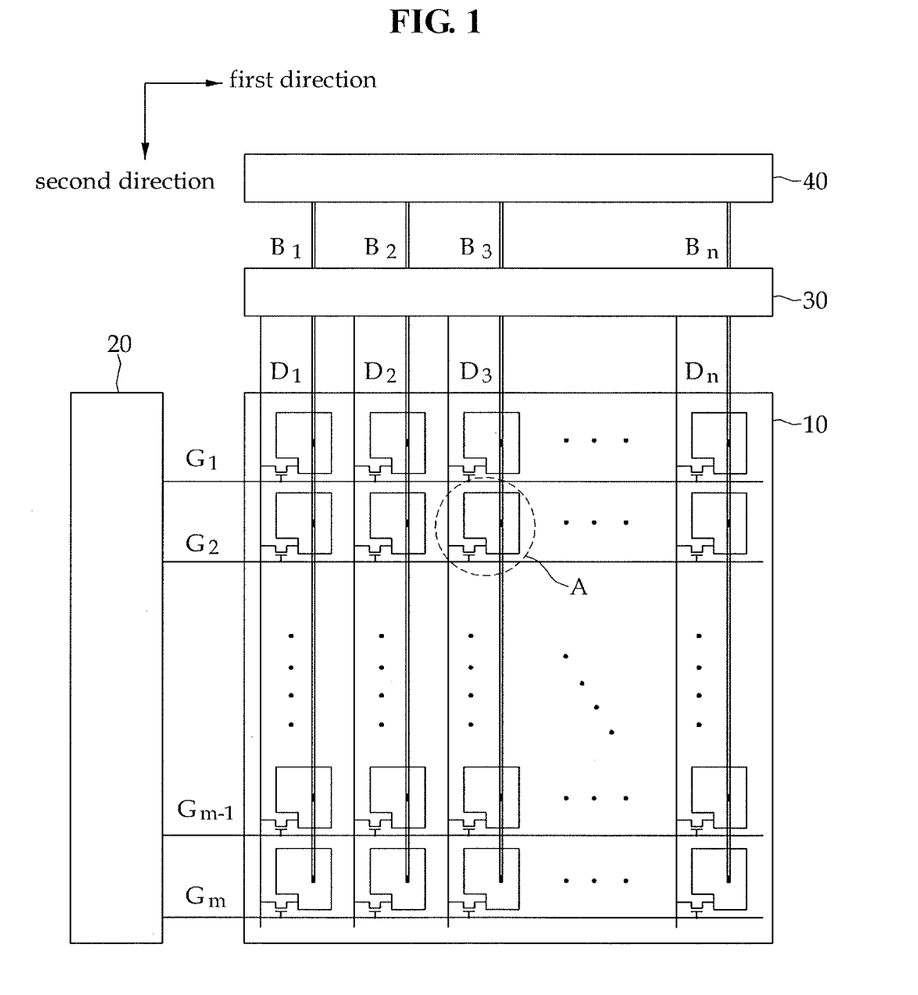
FIG. 1 illustrates one type of X-ray detecting panel which has been proposed.

FIG. 1 illustrates one type of X-ray detecting panel which has been proposed. This panel includes an X-ray detector 10, a gate drive unit 20, an electrical signal detector 30, and a bias power supply unit 40.

Figure 2A:
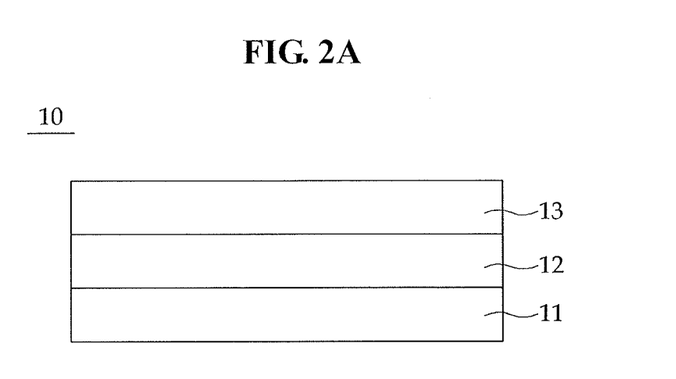
FIGS. 2A and 2B illustrate structures for an X-ray detector in FIG. 1.
Figure 2B:
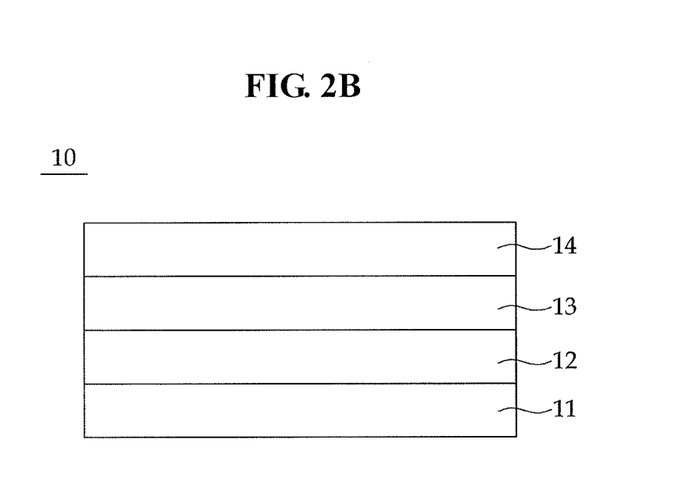

FIGS. 2A and 2B illustrate structures for the X-ray detector 10. Referring to FIG. 2A, the X-ray detector 10 may include a thin film transistor 12 on a substrate 11 and a photoelectric conversion part 13 connected to the thin film transistor 12. As illustrated in FIG. 2B, the X-ray detector 10 may further include a scintillator layer 14 on the photoelectric conversion part 13.

Referring to FIGS. 1, 2A, and 2B, X-ray detector 10 includes a plurality of gate lines ($G_1$-$G_m$) extending in a first direction, a plurality of data lines ($D_1$-$D_n$) extending in a second direction orthogonal to the first direction, a plurality of cells. Each cell includes a thin film transistor (TFT) and a photoelectric conversion element (P) in respective areas defined by the gate and data lines. An example of a cell is shown in area A. Additionally, a plurality of bias lines ($B_1$-$B_n$) are included for applying power to the photoelectric conversion element (P).

The gate drive unit 20 is connected to the plurality of gate lines ($G_1$-$G_m$) of the X-ray detector 10. In operation, the gate drive unit 20 applies a gate signal to each of the gate lines ($G_1$~$G_m$).

The electrical signal detector 30 is connected to the plurality of data lines ($D_1$-$D_n$) of the X-ray detector 10. The electrical signal detector 30 plays a role in receiving electrical signals detected from the data lines ($D_1$~$D_n$).

The bias power supply unit 40 is connected to the plurality of bias lines ($B_1$-$B_n$) of the X-ray detector 10. The bias power supply unit 40 plays a role in applying one or more bias voltages to photoelectric conversion elements (P) connected to the respective bias lines ($B_1$-$B_n$).

Before the X-ray detector 10 is connected to the gate drive unit 20, the electrical signal detector 30, and the bias power supply unit 40, a cell test is performed to determine whether or not there are any problems in the X-ray detector 10. In order to determine whether there are any problems, a bias voltage is applied to the plurality of bias lines ($B_1$~$B_n$) to detect a defect. A defect may occur at an end of the bias lines ($B_1$-$B_n$). The defect may occur as a result of static electricity generated at the end of bias lines ($B_1$-$B_n$). Such a defect may cause a signal to be incorrectly applied to a data line corresponding to the defective bias line.

More specifically, a defect may occur in a cell disposed between the $(m-1)^{th}$ gate line ($G_{m-1}$) and the $m^{th}$ gate line ($G_m$) and connected at an end of a respective one of the bias lines ($B_1$~$B_n$). For example, such defect may appear as a block-shaped smear in which bright areas occur symmetrically with respect to a dark line.

Figure 3:
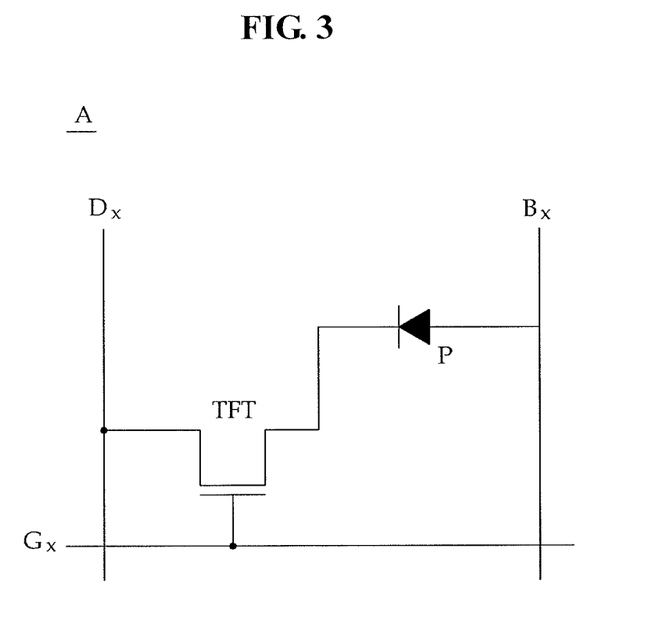
FIG. 3 illustrates a cell in the X-ray detecting panel in FIG. 1.

FIG. 3 illustrates a circuit diagram of a cell (A) in the X-ray detecting panel in FIG. 1. As illustrated in FIG. 3, when a light signal (e.g., visible light) is applied to the photoelectric conversion element (P) in a state where a bias voltage is applied to the photoelectric conversion element (P), the photoelectric conversion element (P) converts the light signal into an electrical signal. The converted electrical signal is detected through a data line connected to the thin film transistor (TFT).

Figure 4A:
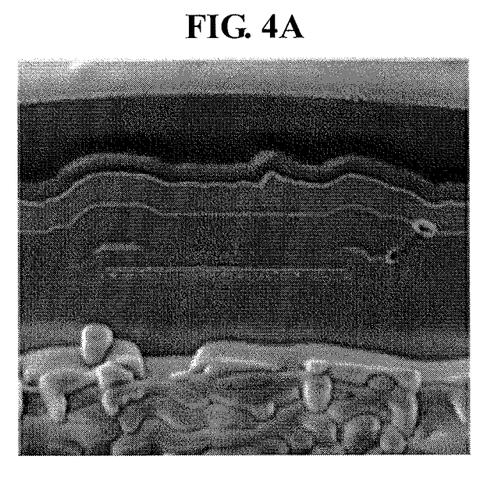
FIG. 4A is a photograph of a defective cell in the X-ray detecting panel.
Figure 4B:
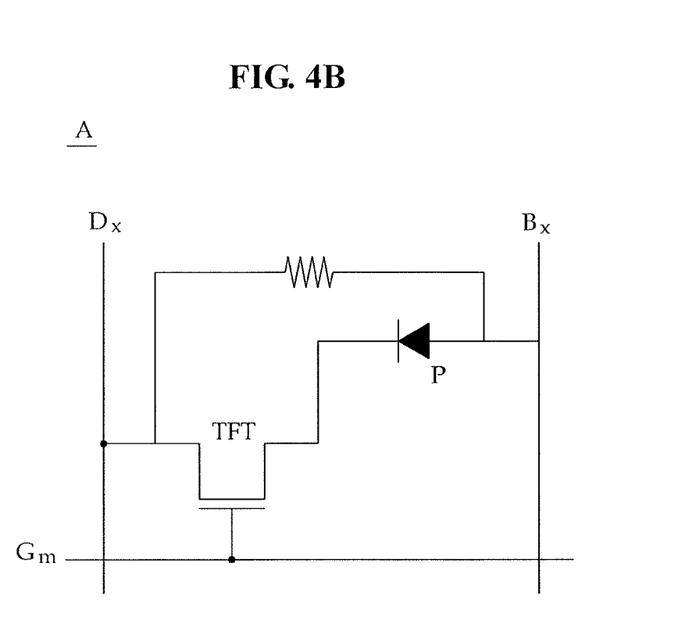
FIG. 4B is a circuit diagram of the defective cell in FIG. 4A.

FIG. 4A is a photograph of a defective cell in the X-ray detecting panel, and FIG. 4B illustrates a circuit diagram of the defective cell in FIG. 4A. Referring to FIGS. 4A and 4B, when a defect occurs at an end of a bias line ($B_1$-$B_n$), an electrical short circuit occurs between the end of the bias line ($B_1$-$B_n$) and a corresponding data line ($D_1$-$D_n$). As a result, a block-shaped smear occurs in the output image. The smear occurs as a result of an undesired electrical signal being applied to a data line corresponding to a bias line in which the static electricity is generated. Consequently, an electrical signal is incorrectly applied to the data line and data lines around the data line.

In accordance with at least one embodiment, the block-shaped smear may be prevented by eliminating the cause of the defect, at a location originating from the cell areas between the $m^{th}$ gate line ($G_m$) and the $(m-1)^{th}$ gate line ($G_{m-1}$).

Figure 5:
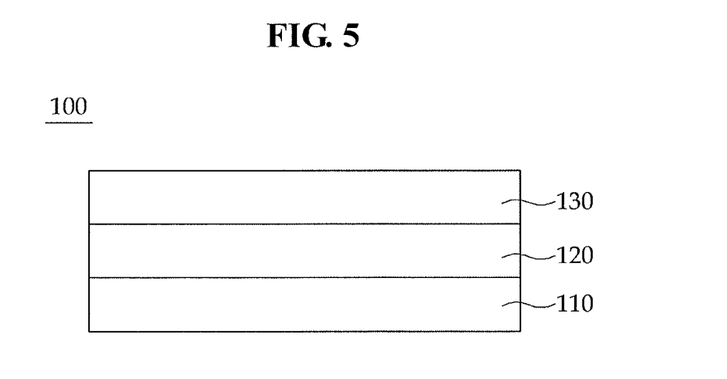
FIGS. 5 and 6 illustrate an embodiment of an X-ray detecting panel.
Figure 6:
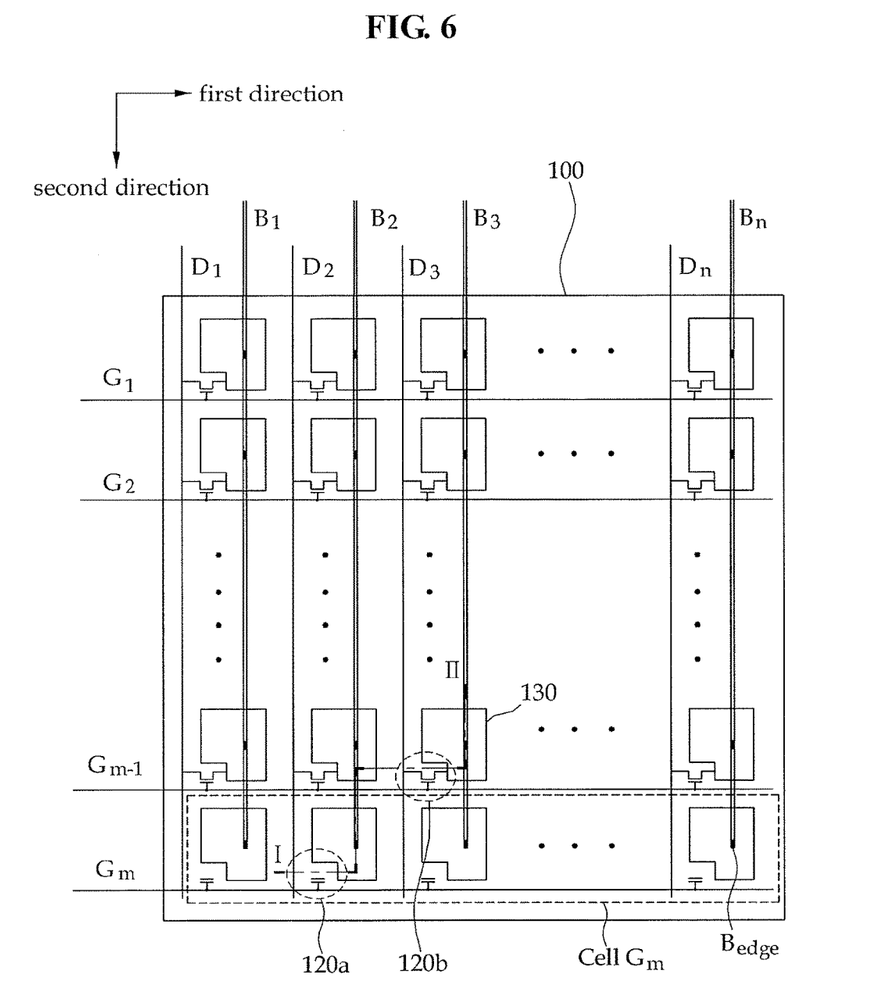

FIGS. 5 and 6 illustrate an X-ray detector 100 and an X-ray detecting panel according to an embodiment. Referring to FIG. 5, an X-ray detector 100 according to one embodiment may include a substrate 110, an element 120, which may be a non-driving element 120a or a thin film transistor 120b, depending on a location on substrate 110, and a photoelectric conversion element 130 connected to the thin film transistor 120b.

More specifically, as illustrated in FIG. 6, X-ray detector 100 may include a substrate 110, a plurality of gate lines ($G_1$-$G_m$) extending in a first direction on the substrate 110, and a plurality of data lines ($D_1$-$D_m$) extending in a second direction orthogonal to the first direction. The detector 100 may also include a plurality of cells, each including the thin film transistor 120b in a cell area defined by the $1^{st}$ gate line to the $(m-1)^{th}$ gate line ($G_1$-$G_{m-1}$) and the data lines ($D_1$-$D_n$). The detector 100 may include a non-driving element 120a in a cell area coupled to the $m^{th}$ gate line ($G_m$) and between corresponding adjacent data lines. The detector may also include a photoelectric conversion element 130 connected to thin film transistor 120b, and a plurality of bias lines ($B_1$-$B_n$) for applying power to the photoelectric conversion elements 130 in the cells.

In order to prevent defects that may occur at ends ($B_{edge}$) of bias lines ($B_1$~$B_n$), the X-ray detector 100 according to the present embodiment may fundamentally prevent static electricity by eliminating factors that may cause the defects at the end ($B_{edge}$) of the bias lines ($B_1$~$B_n$).

One factor that may cause the defects at the end ($B_{edge}$) of the bias lines ($B_1$-$B_n$) is the static electricity of a metal material in the cells disposed in the areas between the $m^{th}$ gate line ($G_m$) and the $(m-1)^{th}$ gate line ($G_{m-1}$). To prevent the formation of static electricity, non-driving elements 120a of cells disposed between the $m^{th}$ gate line ($G_m$) and the $(m-1)^{th}$ gate line ($G_{m-1}$) may not include one or more metal electrodes. That is, non-driving element 120a may not include a source electrode and/or drain electrode included in thin film transistors 120b.

The cells between the $m^{th}$ gate line ($G_m$) and the $(m-1)^{th}$ gate line ($G_{m-1}$) may therefore be considered to be "dummy cells." The dummy cells serve as extra cells manufactured into the X-ray detecting panel. In the present embodiment, the extra cells may be located in the dummy cell area, and thus damage to an X-ray image screen may not occur.

As described above, the cells between the $m^{th}$ gate line ($G_m$) and the $(m-1)^{th}$ gate line ($G_{m-1}$) and connected to ends ($B_{edge}$) of corresponding bias lines ($B_1$-$B_n$) include non-driving element 120a, which does not have source and/or drain electrodes. The occurrence of a block-shaped smear in the resulting image, as previously discussed, may therefore be reduced or prevented.

Figure 7:
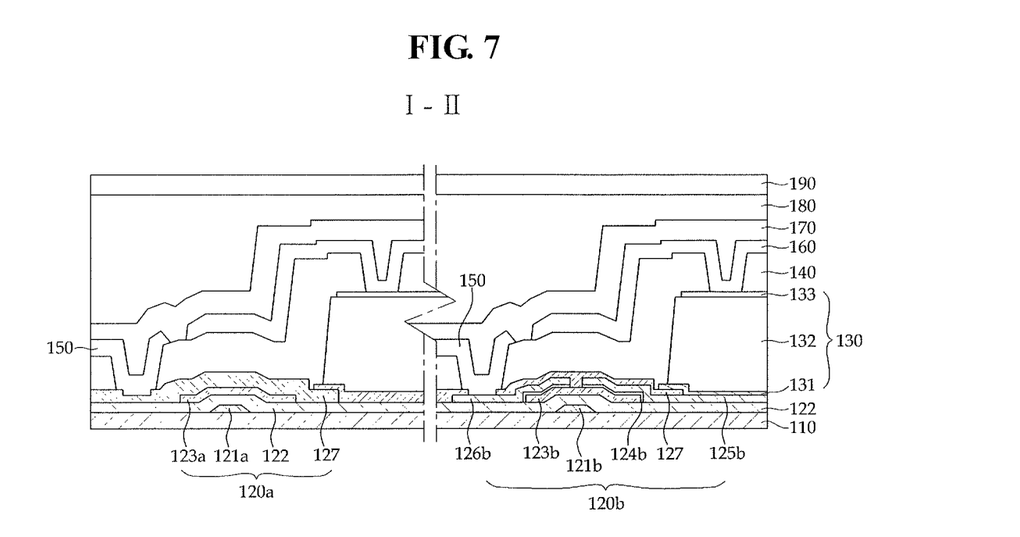
FIG. 7 illustrates a view taken along dotted line I-II in FIG. 6.

FIG. 7 is a cross-sectional view taken along dotted line I-II of FIG. 6. In other words, FIG. 7 illustrates a cross-sectional view of a cell between the $m^{th}$ gate line ($G_m$) and the $(m-1)^{th}$ gate line ($G_{m-1}$), and a cross-sectional view of a cell between the $(m-1)^{th}$ gate line ($G_{m-1}$) and the $(m-2)^{th}$ gate line ($G_{m-2}$).

Referring to FIGS. 6 and 7, X-ray detector 100 according to one embodiment may include substrate 110, non-driving element 120a, and thin film transistor 120b on substrate 110, and the photoelectric conversion element 130.

The non-driving element 120a is disposed between the $m^{th}$ gate line ($G_m$) and the $(m-1)^{th}$ gate line ($G_{m-1}$), and the thin film transistor 120b is disposed between the $(m-1)^{th}$ gate line ($G_{m-1}$) and the $(m-2)^{th}$ gate line ($G_{m-2}$).

In this embodiment, non-driving element 120a includes a gate electrode 121a on substrate 110, a gate insulating layer 122 on gate electrode 121a, and a semiconductor layer 123a on gate insulating layer 122. According to another embodiment, non-driving element 120a may include a gate electrode 121a on substrate 110 and a gate insulating layer 122 on the gate electrode 121a, i.e., without the semiconductor layer 123a. In these embodiments, both the source and drain electrodes of non-driving element 120a are omitted.

The thin film transistor 120b may include a gate electrode 121b on the substrate 110, a gate insulating layer 122 on the gate electrode 121b, a semiconductor layer 123b on the gate insulating layer 122, and a source electrode 125b and a drain electrode 126b on the semiconductor layer 123b.

The substrate 110 may be or include, for example, a glass substrate, a quartz substrate, and/or a transparent resin substrate. The transparent resin substrate may include, for example, a polyimide resin, an acrylic resin, a polyacrylate resin, a polycarbonate resin, a polyether resin, a polyethylene terephthalate resin, a sulfonic acid resin, and the like.

The gate electrode 121a, 121b may include metal, alloy, metal nitride, conductive metal oxide, transparent conductive material, and the like. The gate electrode 121a, 121b may include aluminum (Al), silver (Ag), tungsten (W), copper (Cu), nickel (Ni), chromium (Cr), molybdenum (Mo), titanium (Ti), platinum (Pt), tantalum (Ta), and alloy thereof, aluminum nitride (AlNx), tungsten nitride (WNx), chromium nitride (CrNx), titanium nitride (TiNx), tantalum nitride (TaNx), zinc oxide (ZnOx), indium tin oxide (ITO), tin oxide (SnOx), indium oxide (InOx), gallium oxide (GaOx), and indium zinc oxide (IZO), which may be used alone or in combination with each other.

A gate insulating layer 122 may be provided on gate electrodes 121a, 121b. The gate insulating layer 122 may include silicon nitride (SiNx), silicon oxide (SiOx), hafnium oxide (HfOx), aluminum oxide (AlOx), yttrium oxide (YOx), and tantalum oxide (TaOx), which may be used alone or in combination with each other.

Semiconductor layers 123a, 123b may be provided at positions corresponding to gate electrodes 121a, 121b on gate insulating layer 122. The semiconductor layers 123a, 123b may include amorphous silicon (a-Si) semiconductor, polycrystalline silicon (poly-Si) semiconductor, and oxide semiconductor. The oxide semiconductor may include amorphous-Indium Gallium Zinc Oxide (a-IGZO), Zinc Oxide (ZnO), Indium Zinc Oxide (IZO), Tin Indium Zinc Oxide (TIZO), and Zinc Tin Oxide (ZTO).

A capping layer 127 may be provided on each of the semiconductor layers 123a, 123b, to protect semiconductor layers 123a, 123b and to interrupt interface leakage current. The capping layer 127 may include silicon oxide (SiOx), silicon nitride (SiNx), and silicon oxynitride (SiONx).

One surface, e.g., an entirety of one surface, of semiconductor layer 123a (if used) in the non-driving element 120a may be in direct contact with the capping layer 127. In contrast, an entirety of one surface of the semiconductor layer 123b may not be in direct contact with capping layer 127, i.e., the semiconductor layer 123b may be separate from the capping layer 127 by at least the source and drain electrodes, and in contact with the capping layer 127 only through a space separating the source and drain electrodes.

A source electrode 125 and a drain electrode 126 may be spaced from each other on semiconductor layer 123b. The source electrode 125 and drain electrode 126 may include metal, alloy, metal nitride, conductive metal oxide, transparent conductive material, and the like as in the gate electrode 121a, 121b. The source electrode 125 and drain electrode 126 may include aluminum (Al), silver (Ag), tungsten (W), copper (Cu), nickel (Ni), chromium (Cr), molybdenum (Mo), titanium (Ti), platinum (Pt), tantalum (Ta), and alloy (combination) thereof, aluminum nitride (AlNx), tungsten nitride (WNx), chromium nitride (CrNx), titanium nitride (TiNx), tantalum nitride (TaNx), zinc oxide (ZnOx), indium tin oxide (ITO), tin oxide (SnOx), indium oxide (InOx), gallium oxide (GaOx), and indium zinc oxide (IZO), which may be used alone or in combination with each other.

An ohmic contact layer 124b, which forms an ohmic contact, may be provided between semiconductor layer 123B and source electrode 125 and drain electrode 126. The ohmic contact layer 124B may include amorphous silicon doped at a high concentration.

The photoelectric conversion element 130 may include a first electrode 131, a light conductive layer 132 on the first electrode 131, and a second electrode 133 on the light conductive layer 132. The first electrode 131 may be provided on the gate insulating layer 122. In cells on the $(m-1)^{th}$ gate line ($G_{m-1}$) to the $(m-2)^{th}$ gate line ($G_{m-2}$) the first electrode 131 may be on and electrically connected to the source electrode 125*b*.

The light conductive layer 132 serves as a converter that converts an external signal, namely a light signal (e.g., X-rays and visual light) into an electrical signal. The light conductive layer 132 may include a PIN photodiode formed, for example, a sequential lamination of a n-type semiconductor with a low impurity concentration and a high resistance, an intrinsic semiconductor, and a p-type semiconductor. In addition to the PIN photodiode, the light conductive layer 132 may include a PN photodiode, a Schottky type photodiode, and an avalanche photodiode. The light conductive layer 132 according to one embodiment may include the PIN photodiode.

The second electrode 133 may be provided on light conductive layer 132. The second electrode 133 may include a transparent conductive material such as, for example, indium tin oxide (ITO), indium zinc oxide (IZO), and the like.

In one embodiment, X-ray detector 100 may further include an interlayer insulating layer 140 on the photoelectric conversion element 130, a data line 150 connected to the drain electrode 126*b* through the interlayer insulating layer 140, and a bias line 160 connected to the second electrode 133 through the interlayer insulating layer 140. The interlayer insulating layer 140 may include silicon oxide (SiOx), silicon nitride (SiNx), and silicon oxynitride (SiONx). The interlayer insulating layer 140 may include a single layer or multiple layers.

The data line 150 and bias line 160 may be spaced from each other on the interlayer insulating layer 140. Referring to FIGS. 3 and 4, data line 150 and bias line 160 may extend in a second direction on the substrate 110, and may be provided to be parallel to each other.

The data line 150 and the bias line 160 may include aluminum (Al), silver (Ag), tungsten (W), copper (Cu), nickel (Ni), chromium (Cr), molybdenum (Mo), titanium (Ti), platinum (Pt), tantalum (Ta), and alloy (combination) thereof, aluminum nitride (AlNx), tungsten nitride (WNx), chromium nitride (CrNx), titanium nitride (TiNx), tantalum nitride (TaNx), zinc oxide (ZnOx), indium tin oxide (ITO), tin oxide (SnOx), indium oxide (InOx), gallium oxide (GaOx), and indium zinc oxide (IZO), which may be used alone or in combination with each other.

In one embodiment, X-ray detector 100 may further include a passivation layer 170 on data line 150 and bias line 160, a planarization layer 180 on the passivation layer 170, and a scintillator layer 190 on the planarization layer 180.

The passivation layer 170 may cover data line 150 and bias line 160 and may include, for example, silicon oxide (SiOx), silicon nitride (SiNx), and silicon oxynitride (SiONx). The passivation layer 170 may be formed from a single layer or multiple layers.

A scintillator layer 190 may be provided on the passivation layer 170, in order to convert an incident X-ray signal into a visual light signal. The scintillator layer 190 may include, for example, Cesium iodide. A planarization layer 180 may be provided on passivation layer 170 and scintillator layer 190.

FIGS. 8A to 8D illustrate different operations included in an embodiment of a method for forming a non-driving element 120A and a thin film transistor 120B in an X-ray detecting panel. This method may be included in a method for manufacturing an X-ray detecting panel. This method includes forming a thin film transistor on a substrate 110, forming a photoelectric conversion part on the substrate including the thin film transistor, and arranging a scintillator layer on the substrate including the photoelectric conversion part.

Forming the thin film transistor on the substrate may include forming m number of gate lines and a gate electrode connected to the gate lines, foaming a gate insulating layer on the gate lines and the gate electrode, forming a semiconductor layer in a position corresponding to the gate electrode on the gate insulating layer, forming a data line, and a source electrode and a drain electrode spaced from each other on the semiconductor layer. The source electrode and the drain electrode are not formed on the semiconductor layer of cells between the last two gate lines.

Figure 8A:
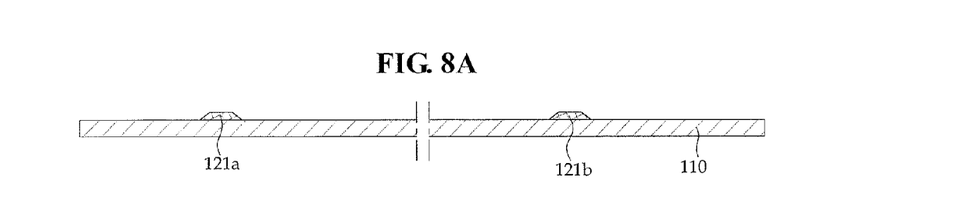
FIGS. 8A to 8D illustrate an embodiment of a method for forming a non-driving element and a thin film transistor in an X-ray detecting panel.

Referring to FIG. 8A, m number of gate lines and the gate electrodes 121*a*, 121*b* connected to the gate lines may be formed on the substrate 110. The gate electrode 121*a* may be connected to the $m^{th}$ gate line and the gate electrode 121*b* may be connected to the $(m-1)^{th}$ gate line. The gate electrodes 121*a*, 121*b* may be formed by patterning a gate electrode-forming material layer on substrate 110. The gate electrode-forming material layer may include metal, alloy, metal nitride, conductive metal oxide, transparent conductive material, and the like.

Figure 8B:
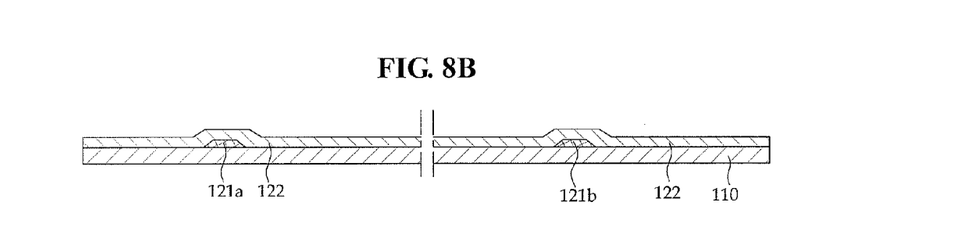

Referring to FIG. 8B, the gate insulating layer 122 may be formed on the gate electrode 121*a*, 121*b*. The gate insulating layer 122 may include silicon oxide, metal oxide, and the like. The gate insulating layer 122 may be formed by using a sputtering process, a chemical vapor deposition (CVD) process, a printing process, a thermal oxidation process, a plasma enhanced chemical vapor deposition (PECVD) process, a high density plasma-chemical vapor deposition (HDP-CVD) process, a vacuum deposition process, a spin coating process, and the like.

Figure 8C:
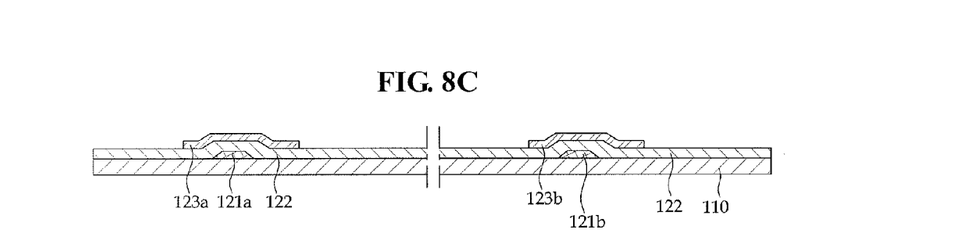

Referring to FIG. 8C, the semiconductor layers 123*a*, 123*b* may be formed in areas corresponding to gate electrodes 121*a*, 121*b*, respectively, on the gate insulating layer 122. The semiconductor layers 123*a*, 123*b* may be formed by coating a semiconductor-forming material layer on the gate insulating layer 122 and patterning the semiconductor-forming material layer. The semiconductor-forming material layer may include amorphous silicon (a-Si) semiconductor, polycrystalline silicon (poly-Si) semiconductor, oxide semiconductor, and the like.

Figure 8D:
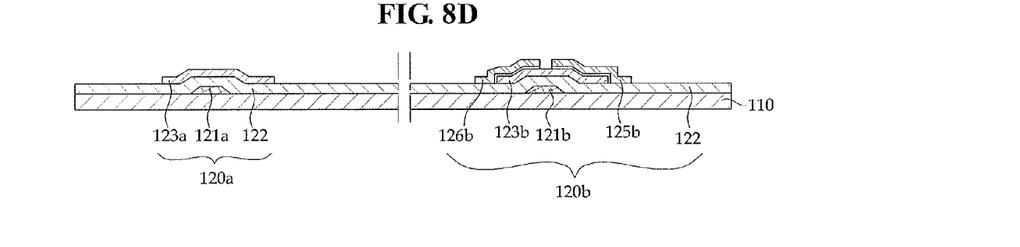

Referring to FIG. 8D, a data line, a source electrode 125*b*, and a drain electrode 126*b* may be formed on semiconductor layer 123*a*, 123*b* in an area between the $1^{st}$ gate line and the $(m-1)^{th}$ gate line. The data line, the source electrode 125*b*, and the drain electrode 126*b* may be formed by coating a source-drain electrode-forming material on the semiconductor layers 123*a*, 123*b* and patterning the source-drain electrode-forming material. The source-drain electrode-forming material may include metal, alloy, metal nitride, conductive metal oxide, transparent conductive material, and the like.

At the same time, the source-drain electrode-forming material may be patterned so that at least one of the source electrode or drain electrode, or both, are not be formed on gate electrode 121*a* between the $m^{th}$ gate line and the $(m-1)^{th}$ gate line.

The semiconductor layer, data line, source electrode, and drain electrode may be formed, for example, by coating sequentially the semiconductor-forming material layer and the source-drain electrode-forming material and patterning the materals simultaneously. In this case, the semiconductor layer may be formed below the data line as well as the source electrode and the drain electrode. The semiconductor layer may not be formed on the gate electrode 121b between the $m^{th}$ gate line and the $(m-1)^{th}$ gate line. As a result, a source electrode and drain electrode are not formed.

Example embodiments have been disclosed herein, and although specific terms are employed, they are used and are to be interpreted in a generic and descriptive sense only and not for purpose of limitation. For example, while the embodiments have indicated that a non-driving element is provided between the $m^{th}$ gate line and the $(m-1)^{th}$ gate line, the non-driving element may be provided in any region of the detecting panel that is to serve as a dummy cell area. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An X-ray detecting panel comprising:
a substrate;
m gate lines on the substrate;
n data lines on the substrate and intersecting the m gate lines;
a thin film transistor in an area between adjacent gate lines of the first gate line to the $(m-1)^{th}$ gate line on the substrate;
a non-driving element in an area between the $(m-1)^{th}$ gate line and the $m^{th}$ gate line on the substrate; and
a photoelectric converter connected to the thin film transistor, wherein the thin film transistor and the non-driving element are connected to different ones of the gate lines, wherein the non-driving element includes a gate electrode connected to the $m^{th}$ gate line and a semiconductor layer insulated from the gate electrode, and does not include a source electrode and a drain electrode.

2. The panel as claimed in claim 1, wherein an entire surface of the semiconductor layer is in direct contact with an insulating layer.

3. The panel as claimed in claim 2, wherein the insulating layer includes a gate insulating layer and a capping layer.

4. The panel as claimed in claim 3, wherein one surface of the semiconductor layer is in direct contact with the gate insulating layer and at least one other surface of the semiconductor layer is in direct contact with the capping layer.

5. The panel as claimed in claim 1, further comprising:
a second photoelectric converter connected to the $m^{th}$ gate line,
wherein the non-driving element is between the second photoelectric converter and a correponding one of the n data lines.

6. An X-ray detecting panel, comprising:
a substrate;
m gate lines on the substrate;
n data lines on the substrate and intersecting the m gate lines;
a thin film transistor in an area between adjacent gate lines of the first gate line to the (m−1)th gate line on the substrate;
a non-driving element in an area between the (m−1)th gate line and the mth gate line on the substrate; and
a photoelectric converter connected to the thin film transistor, wherein the thin film transistor and the non-driving element are connected to different ones of the gate lines, wherein the non-driving element includes a gate electrode connected to the $m^{th}$ gate line and a gate insulating layer covering the gate electrode, and does not include a source electrode and a drain electrode, wherein the non-driving element does not include a semiconductor layer, a source electrode, and a drain electrode.

* * * * *